United States Patent [19]

Onyshkevych

[11] 4,201,965
[45] May 6, 1980

[54] INDUCTANCE FABRICATED ON A METAL BASE PRINTED CIRCUIT BOARD

[75] Inventor: Lubomyr S. Onyshkevych, Lawrenceville, N.J.

[73] Assignee: RCA Corporation, New York, N.Y.

[21] Appl. No.: 920,461

[22] Filed: Jun. 29, 1978

[51] Int. Cl.² .................................. H01F 27/28
[52] U.S. Cl. .................................. 336/180; 336/184; 336/200; 336/232
[58] Field of Search .................. 336/200, 232, 84 C, 336/184, 84 R, 180

[56] References Cited

U.S. PATENT DOCUMENTS

| | | | |
|---|---|---|---|
| 2,847,651 | 8/1958 | Schamanek | 336/232 X |
| 3,191,136 | 6/1965 | Connell et al. | 336/200 X |
| 3,277,416 | 10/1966 | Barr | 336/84 C |
| 3,458,843 | 7/1969 | Lord | 336/84 C |
| 3,465,274 | 9/1969 | Proctor | 336/200 X |
| 3,483,499 | 12/1969 | Lugten | 336/232 X |
| 3,798,059 | 3/1974 | Astle et al. | 336/200 X |
| 3,851,287 | 11/1974 | Miller et al. | 336/84 C |
| 4,012,703 | 3/1977 | Chamberlayne | 336/200 X |
| 4,080,585 | 3/1978 | Molthen | 336/200 |

FOREIGN PATENT DOCUMENTS 2054457 5/1972 Fed. Rep. of Germany .......... 336/200

OTHER PUBLICATIONS

Altman et al., "IBM Technical Disclosure Bulletin", Printed Delay Line, vol. 8, No. 5, Oct. 1965, p. 741.

Primary Examiner—Thomas J. Kozma
Attorney, Agent, or Firm—Eugene M. Whitacre; Paul J. Rasmussen; Joseph J. Laks

[57] ABSTRACT

A high-Q printed circuit board inductance comprises a ferromagnetic core placed through an aperture of a metallic support base of a printed circuit board. The ferromagnetic core provides a preferred path for time-varying magnetic flux. An overlayer of insulating material such as porcelain enamel is interposed between a planar printed coil structure located about the ferromagnetic core and the metallic support base. A gap is formed in the metallic support base and extends outwardly from the aperture in a manner intersecting closed paths within the metallic support base that are linked by the time-varying magnetic flux. A high-Q inductance is formed because the flow of eddy currents in the closed paths is substantially impeded across the gap.

14 Claims, 7 Drawing Figures

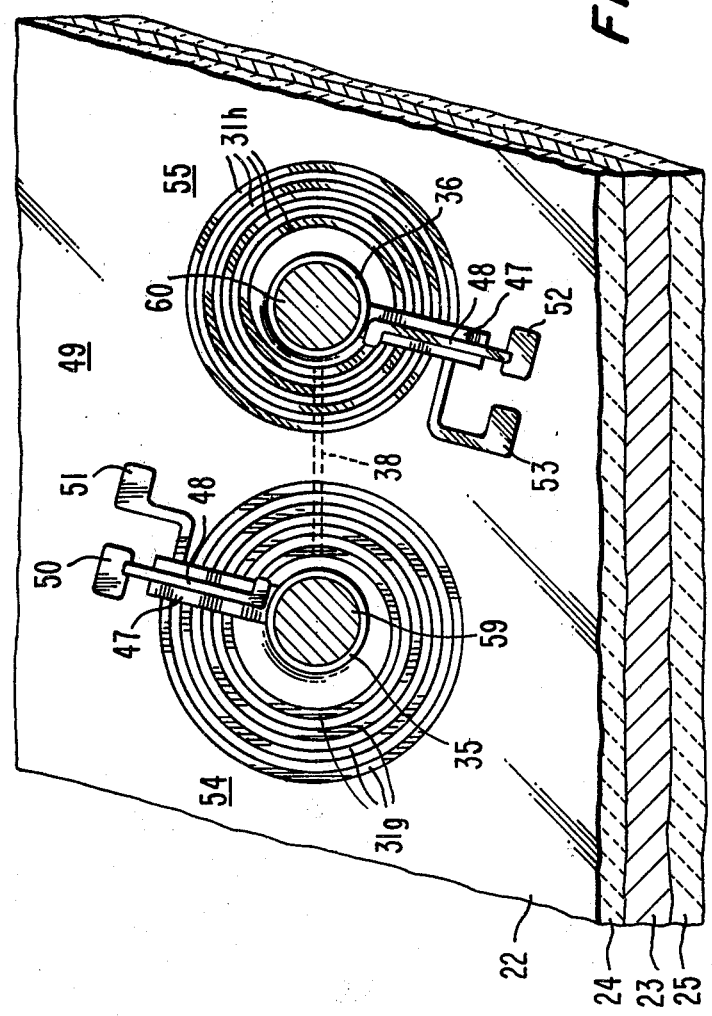

though with less than an integral number of turns if $N_1$, $N_2$, $N_3$ and $N_4$ are not integers.

INDUCTANCE FABRICATED ON A METAL BASE PRINTED CIRCUIT BOARD

BACKGROUND OF THE INVENTION

This invention relates to inductances fabricated on metal base printed circuit boards.

Various types of printed circuit boards are available for use as support bases for electrical components. Phenolic boards are in common use and are relatively inexpensive. Copper conductor lines are printed on these boards and connect discrete electrical components such as resistors, capacitors and inductors that are inserted into holes formed in the boards. Large area phenolic boards may require metal support frames to provide structural rigidity and prevent the boards from sagging and cracking under the weight of such relatively heavy components as transformers.

Metal base printed circuit boards provide relatively great structural strength. An insulating layer such as epoxy or porcelain enamel is deposited over the metal base and maintains electrical isolation between the metal base and the electrical components located on the board. The metal base also functions as a relatively good heat-sink to dissipate thermal energy developed by power devices located on the board.

On porcelain coated metal base printed circuit boards, it is possible not only to print metal conductors but also to integrally fabricate such electrical components as thick film resistors and delay lines. Relatively small valued inductors have been fabricated on such materials as fiberglass or solid alumina. It is desirable to also fabricate inductors and transformers on metal base printed circuit board. Such metal base printed circuit board inductances should be capable of fabrication with large inductance values and high-Q values, keeping resistive losses to a minimum.

SUMMARY OF THE INVENTION

A high-Q inductance fabricated on a metallic base printed circuit board comprises a ferromagnetic core placed through a first aperture in the printed circuit board metallic support base for providing a preferred path in the ferromagnetic core for time-varying magnetic flux. An electrically conductive printed coil structure is located about the ferromagnetic core and generates the time-varying magnetic flux. An overlayer of insulating material is interposed between the printed coil structure and the metallic support base for providing electrical insulation from the metallic support base. A gap is formed in the metallic support base and extends outwardly from the vicinity of the first aperture in a manner that will intersect closed paths within the metallic support base that are linked by the time-varying magnetic flux for forming a high-Q inductance by substantially impeding across the gap the flow of dissipative eddy currents in the closed paths.

BRIEF DESCRIPTION OF THE DRAWING

FIG. 7 illustrates still another metal base printed circuit board transformer embodying the invention.

DESCRIPTION OF THE INVENTION

Figure 1:
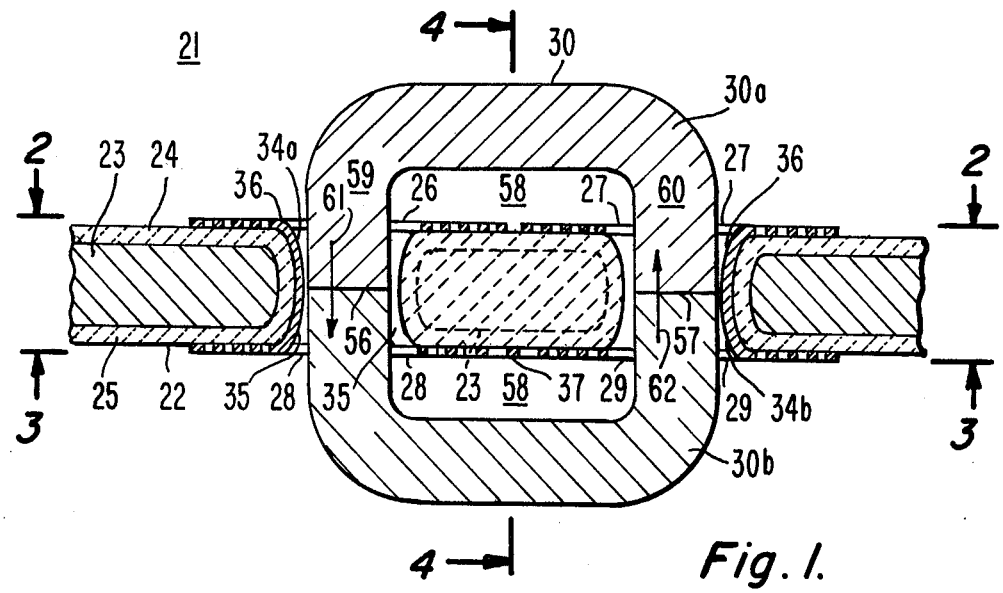
FIG. 1 illustrates a cross-sectional view of a metal base printed circuit board inductance embodying the invention.

A printed inductance 21 fabricated on a metal base printed circuit board 22 embodying the invention is illustrated in cross-sectional view in FIG. 1. A metal base portion 23 functions in part to provide structural strength to the board 22. The metal base 23 may be formed of such electrically conductive material as steel or aluminum. The thickness of base 23 may typically be 0.035 inch or approximately 20 gauge if steel is used as the material. A first overlayer insulating layer 24 of electrically insulating material is deposited or coated on one side of base 23. A second insulating layer 25 may simultaneously be deposited on the other side of base 23. The insulating material may comprise porcelain enamel. Each insulating layer may be approximately 0.007 inch thick.

Two apertures 35 and 36 are formed in the metal base 23 of board 22. The porcelain insulating material is also deposited over the walls of each aperture. Two "C" shaped ferromagnetic circular cross-sectioned core sections 30a and 30b of a ferromagnetic core 30 are inserted in apertures 35 and 36, with the ends of each core section butting against the ends of the other along the respective joint surfaces 56 and 57. The ferromagnetic core 30 may be formed of a highly permeable material such as ferrite.

Figure 2:
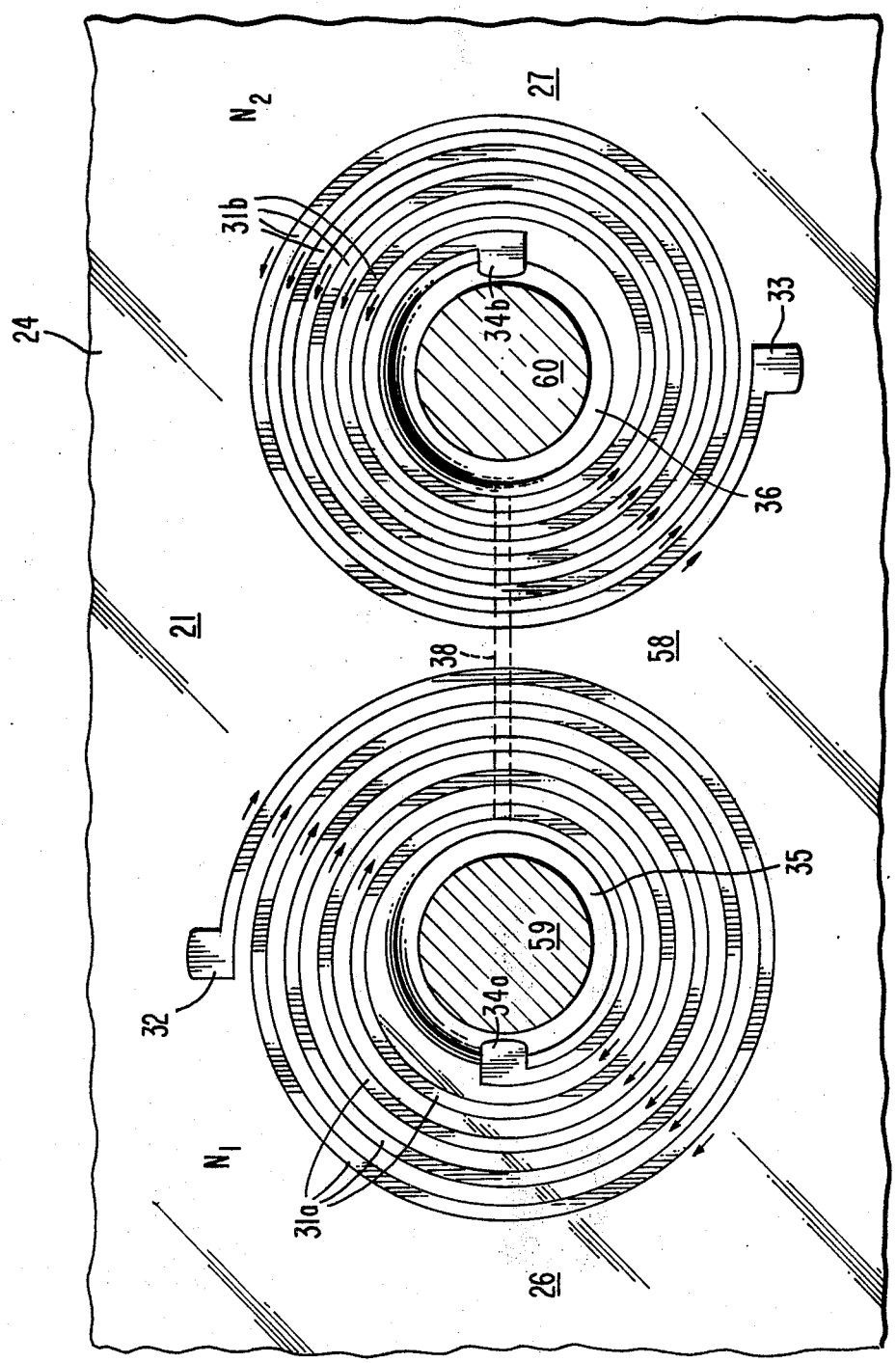
FIG. 2 illustrates a view of the inductance of FIG. 1 taken along the line 2—2.
Figure 3:
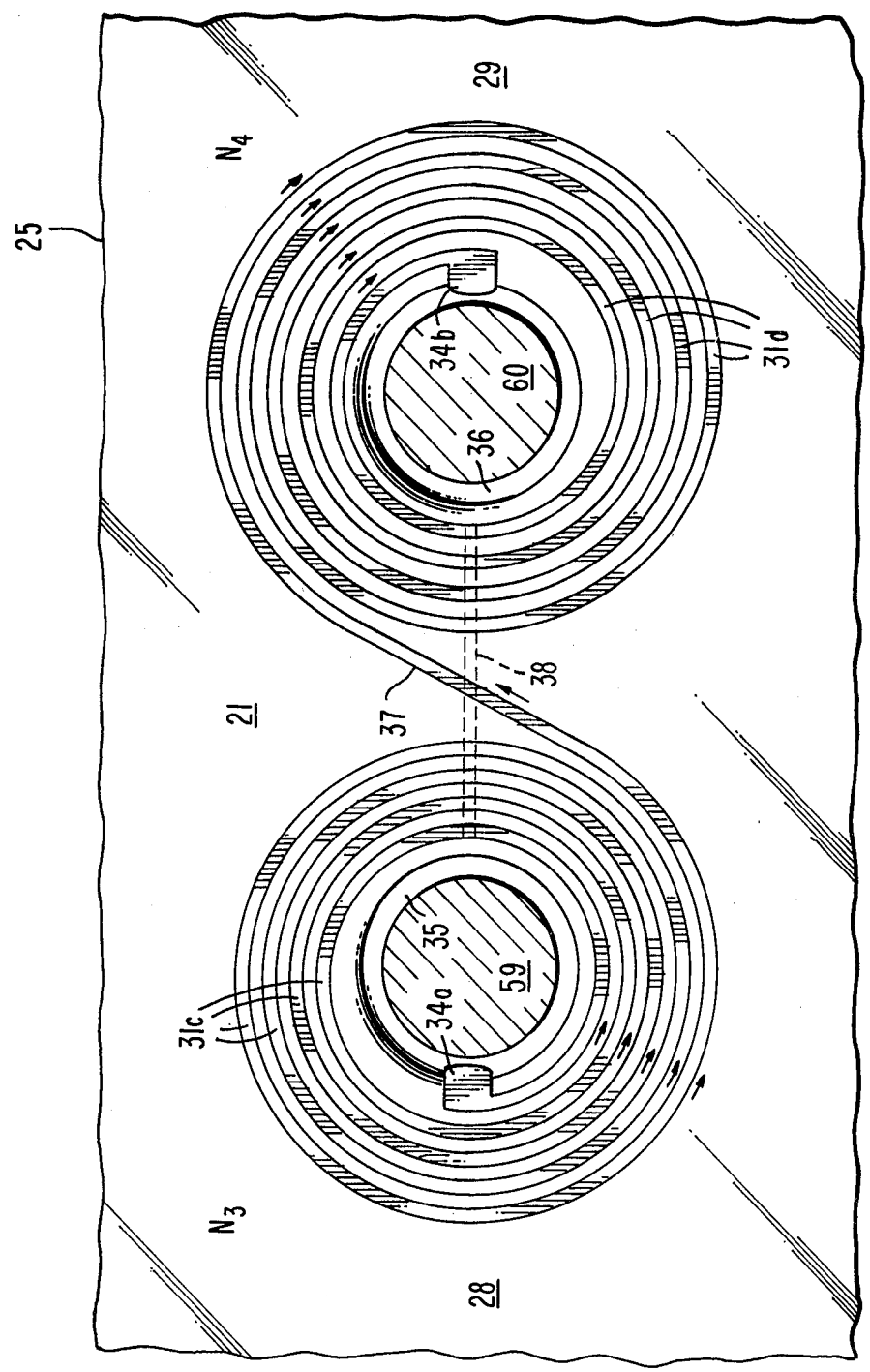
FIG. 3 illustrates a view of the inductance of FIG. 1 taken along the line 3—3.

As illustrated in FIGS. 1–3, an electrically conductive planar printed coil structure 58 is located about legs 59 and 60 of ferromagnetic core 30. Coil structure 58 comprises four individual spiral coils 26–29, each spiral coil comprising a plurality of spiral arms or lines 31a–31d, each coil with respective number of turns $N_1$, $N_2$, $N_3$, and $N_4$. Spiral coils 26 and 27 are located adjacent the first porcelain insulating overlayer 24, and coils 28 and 29 are located adjacent the second insulating layer 25. Insulating layers 24 and 25 are interposed between metal base 23 and the spiral coils 26–29 to provide electrical insulation of the coils from the base.

Electrical continuity between spiral coils 26 and 28 is provided by a through hole conductor 34a which connects the innermost spiral lines of coils 26 and 28. Similarly, electrical continuity between spiral coils 27 and 29 is provided by a through hole conductor 34b. Electrical continuity between coils 28 and 29 is provided by a diagonal conductive connecting line 37 which connects the outermost spiral lines of coils 28 and 29.

To connect printed inductance 21 to other circuitry located on or off the printed circuit board 22, conductive terminal pads 32 and 33 are deposited on the first insulating layer 24, with terminal pad 32 connected to the outermost spiral line of spiral coil 26 and terminal pad 33 connected to the outermost spiral line of spiral coil 27.

With electrical interconnection of spiral coils 26–27 as described above, the coils are in effect coupled together in series aiding fashion. Inductance 21 therefore forms an inductor with the number of turns equal approximately to $N = N_1 + N_2 + N_3 + N_4$.

When a source of alternating current not shown is coupled to terminal pads 31 and 32, a time-varying magnetic flux is developed in ferromagnetic core 30 linking coils 26–29. With the instantaneous current flowing in the coils as shown by the arrows in FIGS. 2 and 3, the flux directions in legs 59 and 60 of ferromagnetic core piece 30 are shown by respective arrows 61 and 62.

Figure 5:
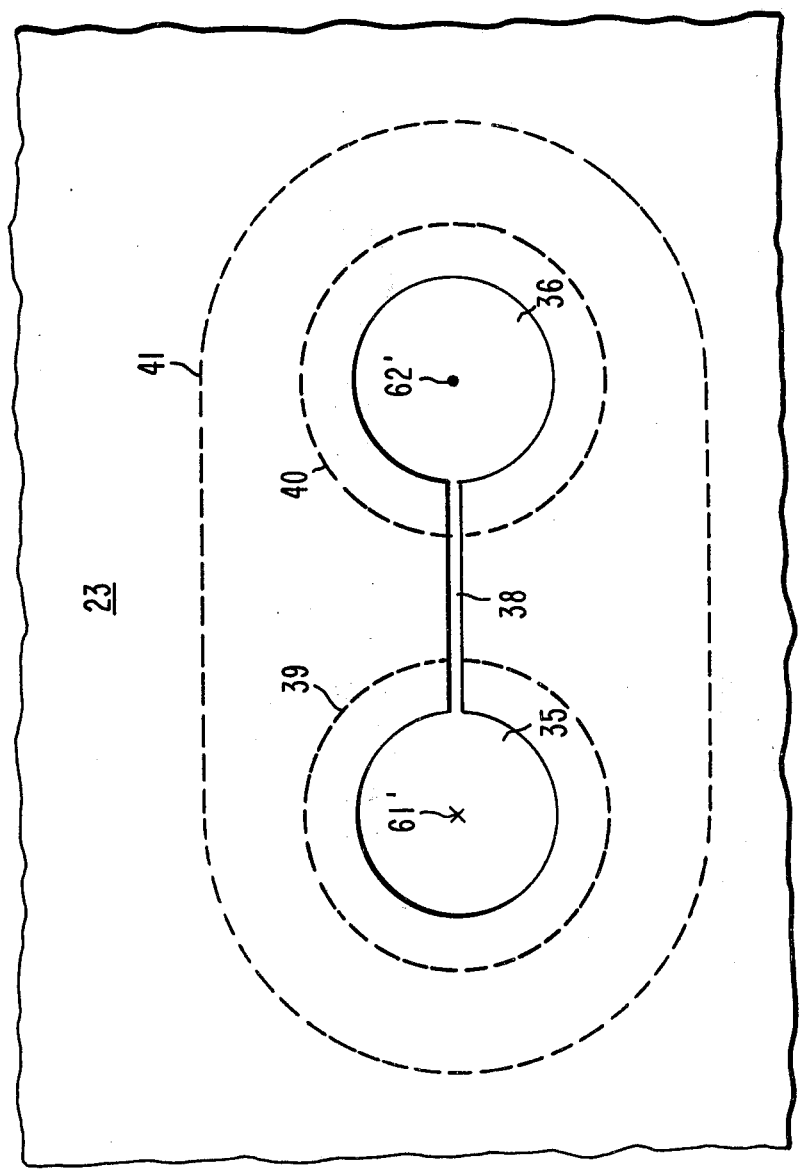
FIG. 5 illustrates the metal base portion of the printed circuit board illustrated in FIG. 1.

FIG. 5 illustrates the metal base 23 of printed circuit board 22 without the porcelain insulating layers 24 and 25, ferromagnetic core 30, and printed coil structure 58. The direction of the flux lines in leg 59 is indicated by a cross mark 61, and the direction in leg 60 is indicated by a dot 62. These directions correspond to the respective directions illustrated by arrows 61 and 62 of FIG. 1.

As illustrated by the dashed circle, a closed path 39 exists within the electrically conductive metal base 23 that is linked by the time-varying magnetic flux in leg 59. A similar closed path 40 is linked by the flux in leg 60. The electrically conductive material such as steel or aluminum of metal base 23 will support large eddy currents in such closed paths as 39 and 40, resulting in relatively large eddy current resistive losses and a relatively substantial reduction in the Q value of inductance 21.

Figure 4:
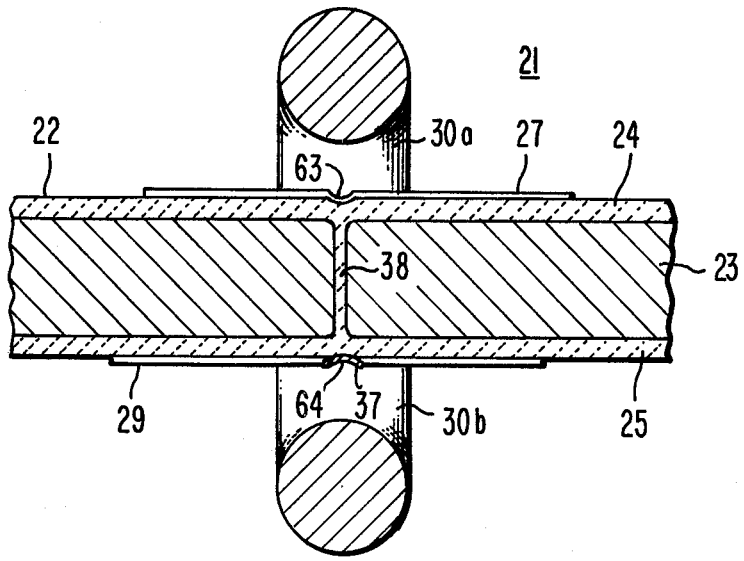
FIG. 4 illustrates a view of the inductance of FIG. 1 taken along the line 4—4.

To prevent the establishment of such eddy currents and their resulting dissipation losses, a gap or slot 38 is formed in metal base 23 extending through the thickness of the base and extending from aperture 35 to aperture 36, as illustrated in FIGS. 4 and 5. When depositing porcelain insulating layers 24 and 25 over metal base 23, gap 38 becomes filled with an electrically insulating material and will not support the flow of current.

With gap 38 traversing the metal base from aperture 35 to aperture 36, the gap in effect extends outwardly from each aperture in a manner that intersects closed paths 39 and 40 that are each linked by the time-varying magnetic flux, in the ferromagnetic core 30. The gap should be of sufficient width to provide a relatively large impedance to eddy currents generated within the closed paths to substantially reduce eddy current losses. Because of capacitive effects along the gap walls, the gap width may be required to be greater at the higher frequencies.

It should be noted that little eddy currents will be generated in closed path 41 of FIG. 5, as this closed path surrounds both legs 59 and 60 of ferromagnetic core 30, the net flux in linking path 41 thereby being substantially reduced.

The apertures 35 and 36 in metal base 23 and gap 38 may be formed for example by punching through the base using appropriately shaped dies. The apertures and gap are deburred, cleaned, and prepared for conventional electrophoretic deposition of the porcelain insulating layers. The porcelain enamel is electrophoretically deposited on both surfaces of the core and in the walls of the apertures and in the gap. Other conventional deposition techniques may also be used.

The width of gap 38 should be less than twice the thickness of a porcelain layer 24 or 25; otherwise gap 38 will not be completely filled with porcelain deposits. Furthermore the greater the gap width, the more pronounced will be the depressions that are formed in the porcelain layers deposited over the gap, as illustrated by depressions 63 and 64 of FIG. 4. Incomplete screening of a conductor line such as diagonal connecting conductor 37 may result. For a thickness of layer 24 or 25 of 0.007 inch, typically a gap width of about 0.006 inch will result in relatively small depressions 63 and 64.

After deposition of the porcelain, suitably designed silk screens are placed over each insulating layer 24 and 25, and the conductive thick film copper or silver ink pattern of planar coil structure 58 is printed on the insulating layers 24 and 25. At the same time the through hole conductors 34a and 34b are printed through the walls of apertures 35 and 36 by vacuum suction. Plating, painting, or etching techniques may alternatively be used to form the printed coil pattern. If printing of the through hole conductors is not desired, suitably shaped metal eyelets, not shown, may be substituted and inserted in apertures 35 and 36. When using a screening deposition process, the width of each spiral line typically is 0.010 inch with the separation between lines about 0.010 inch. Thick film patterns of a thickness approximately 0.0007 to 0.001 inch are printed.

Figure 6:
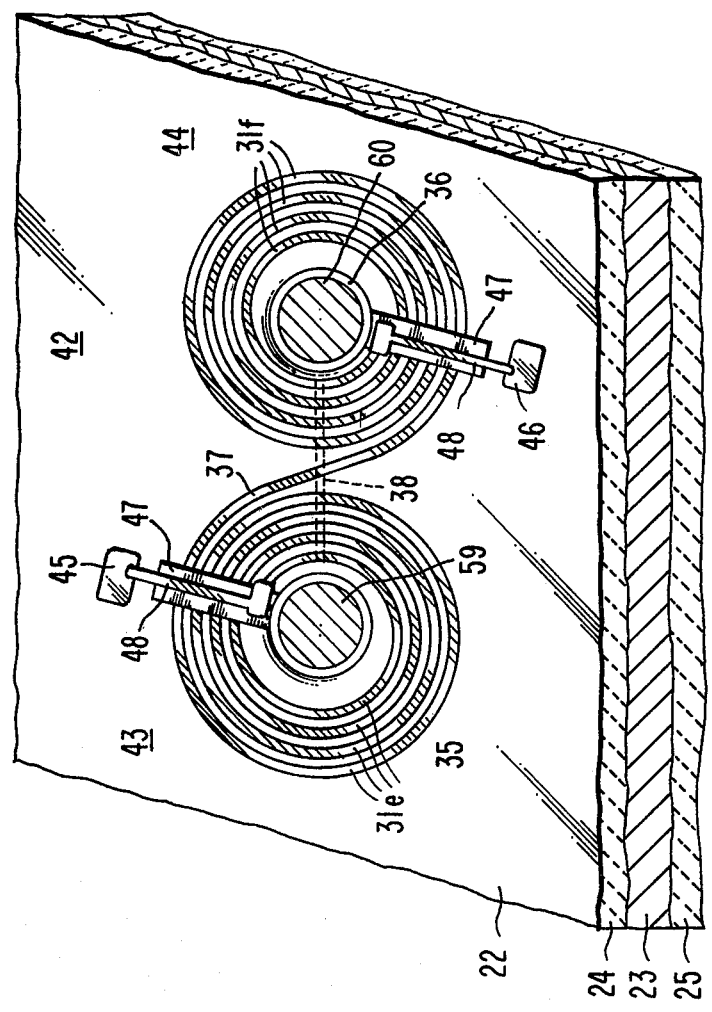
FIG. 6 illustrates another metal base printed circuit board inductance embodying the invention.

FIG. 6 illustrates a printed inductor 42 formed only on one side of metal base printed circuit board 22. Terminal pads 45 and 46 connecting the inductor to other circuitry are associated with spiral coils 43 and 44 respectively. Diagonal connecting conductor 37 connects the outermost spiral line 31e of coil 43 with the outermost spiral line 31f of coil 44.

To connect the innermost spiral line 31e to terminal pad 45, a crossover insulating layer 47 is deposited over the remainder of the spiral line 31e. Then a radial conductive connecting line 48 is deposited over crossover layer 47 and connects the innermost spiral line 31e with terminal pad 45. A similar arrangement of a crossover insulating layer 47 and a radial connecting line 48 connects the innermost spiral line 31f of coil 44 with terminal pad 46.

As illustrated in FIG. 6, a gap 38 is formed in the metal base 23 of printed circuit board 22 extending from aperture 35 to aperture 36. The gap provides a high impedance to eddy currents that may be generated in closed paths around each of the ferromagnetic core legs 59 and 60.

FIG. 7 illustrates a transformer 49 formed on one side of metal base printed circuit board 22. The primary winding of transformer 49 comprises illustratively spiral coil 54 and the secondary winding comprises spiral coil 55. Terminal pads 50 and 51 connect the primay winding to other circuitry. Similarly connecting the secondary winding are terminal pads 52 and 53. Radial connecting conductors 48 deposited over crossover layers 47 connect the innermost spiral lines 31g and 31h of respective coils 54 and 55 with respective terminal pads 50 and 52.

Alternatively, transformer 49 may have spiral coils 54 and 55 formed only around aperture 35 with the spiral lines 31g and 31h being interleaved. As a still other alternative, spiral coil 54 may be formed over insulating layer 24 and coil 55 formed over insulating layer 25. As illustrated in FIG. 7, a gap 38 in metal base 23 extends outwardly from each aperture in a manner that intersects closed paths within the base that are linked by the time varying magnetic flux in ferromagnetic core 30.

What is claimed is:

1. A high-Q inductance for a metallic base printed circuit board, comprising:

a printed circuit board metallic support base;
   a ferromagnetic core placed through a first aperture in said metallic support base for providing a preferred path in said ferromagnetic core for time-varying magnetic flux;

an overlayer of insulating material deposited on said metallic support base for providing electrical insulation from said metallic support base;

an electrically conductive printed coil structure deposited on said overlayer and located about said ferromagnetic core for generating said time varying magnetic flux, said metallic support base including a gap extending outwardly from the vicinity of said first aperture in a manner that will intersect closed paths within said metallic support base that are linked by said time-varying magnetic flux for forming a high-Q inductance by substantially impeding across said gap the flow of dissipative eddy currents in said closed paths.

2. An inductance according to claim 1 wherein an insulating material is deposited within said gap, at least a portion of said printed coil structure being deposited over the insulating material within said gap.

3. An inductance according to claim 2 including a second aperture in said metallic support base through which second aperture said ferromagnetic core is placed.

4. An inductance according to claim 3 wherein said gap extends from the vicinity of said first aperture to the vicinity of said second aperture.

5. An inductance according to claim 4 wherein the insulating material of said overlayer comprises a porcelain enamel.

6. An inductance according to claim 1 including a second layer of insulating material deposited on a surface of said metallic support base opposite said overlayer.

7. An inductance according to claim 6 wherein said printed coil structure comprises first and second spiral coils.

8. A high-Q inductance for a metallic base printed circuit board, comprising:

a printed circuit board metallic support base;

a ferromagnetic core placed through a first aperture in said metallic support base for providing a preferred path in said ferromagnetic core for time-varying magnetic flux;

an electrically conductive printed coil structure located about said ferromagnetic core for generating said time-varying magnetic flux;

an overlayer of insulating material interposed between a first spiral coil of said printed coil structure and said metallic support base for providing electrical insulation from said metallic support base; and a second layer of insulating material deposited on a surface of said metallic support base opposite said overlayer, said second layer being interposed between a second spiral coil of said printed coil structure and said metallic support base, said metallic support base including a gap extending outwardly from the vicinity of said first aperture in a manner that will intersect closed paths within said metallic support base that are linked by said time-varying magnetic flux for forming a high-Q inductance by substantially impeding across said gap the flow of dissipative eddy currents in said closed paths.

9. An inductance according to claim 8 including a first through hole connecting conductor connecting a spiral line of each of said first and second spiral coils through said first aperture.

10. An inductance according to claim 9 including third and fourth spiral coils located about a portion of said ferromagnetic core placed through a second aperture in said metallic support base, said overlayer of insulating material interposed between said third spiral coil and said metallic support base, said second layer of insulating material interposed between said fourth spiral coil and said metallic support base, and including a second through hole connecting conductor connecting a spiral line of each of said third and fourth spiral coils through said second aperture.

11. An inductance according to claim 10 including a diagonal connecting conductor connecting outer spiral lines of said first and third spiral coils, said first through hole connecting conductor connecting inner spiral lines of said first and second spiral coils, said second through hole conductor connecting inner spiral lines of said second and fourth spiral conductors for forming a coil structure with series aiding spiral coils.

12. An inductance according to claim 7 wherein a diagonal connecting conductor connects the outer spiral arms of said first and second spiral coils in a series aiding manner.

13. An inductance according to claim 7 wherein said first spiral coil comprises a first winding of a transformer and said second spiral coil comprises a second winding of said transformer.

14. A printed circuit board inductance, comprising:

a printed circuit board base portion formed of an electrically conductive material;

a layer of insulating material deposited on said base portion;

a ferromagnetic core piece placed through an aperture in said printed circuit board base portion and said layer for providing a preferred magnetic flux path;

an electrically conductive printed coil structure located about said ferromagnetic core piece and deposited on said layer of insulating material; and a source of alternating current coupled to said printed coil structure for developing a time-varying magnetic flux in said ferromagnetic core piece, said printed circuit board base portion being provided with a gap in said electrically conductive material extending from said aperture outwardly in a manner that will intersect closed paths within said electrically conductive material that are linked by said time-varying flux, said gap of sufficient width to provide a relatively large impedance to eddy currents generated in said closed paths by said time-varying magnetic flux for substantially reducing eddy current dissipation, said insulating material being deposited in said gap, at least a portion of said printed coil structure being deposited over said gap.

* * * * *